(12) United States Patent
Murari et al.

(10) Patent No.: US 6,784,522 B2
(45) Date of Patent: Aug. 31, 2004

(54) ELECTRONIC SEMICONDUCTOR DEVICE HAVING A THERMAL SPREADER

(75) Inventors: Bruno Murari, Monza (IT); Ubaldo Mastromatteo, Bareggio (IT); Benedetto Vigna, Pietrapertosa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 59 days.

(21) Appl. No.: 09/874,381

(22) Filed: Jun. 4, 2001

(65) Prior Publication Data
US 2002/0017705 A1 Feb. 14, 2002

(30) Foreign Application Priority Data
Jun. 6, 2000 (EP) .............................................. 00830407

(51) Int. Cl.⁷ .............................................. H01L 29/72
(52) U.S. Cl. ..................... 257/666; 257/667; 257/668; 257/698; 257/699
(58) Field of Search .................................. 257/666, 667, 257/668, 698, 699

(56) References Cited

U.S. PATENT DOCUMENTS

| | | | |
|---|---|---|---|
| 3,978,578 A | 9/1976 | Murphy | 29/577 |
| 5,138,439 A | 8/1992 | Kobiki | 357/80 |
| 5,521,425 A | 5/1996 | Deeney | 257/666 |
| 5,907,477 A | 5/1999 | Tuttle et al. | 361/760 |
| 6,093,970 A * | 7/2000 | Ohsawa et al. | 257/777 |
| 6,307,261 B1 * | 10/2001 | Val et al. | 257/698 |

FOREIGN PATENT DOCUMENTS

EP    0618619 A1    10/1994

* cited by examiner

*Primary Examiner*—Edward Wojciechowicz
(74) *Attorney, Agent, or Firm*—Lisa K. Jorgenson; Harold H. Bennett II; Seed IP Law Group PLLC

(57) ABSTRACT

The electronic device is formed in a die including a body of semiconductor material having a first face covered by a covering structure and a second face. An integral thermal spreader of metal is grown galvanically on the second face during the manufacture of a wafer, prior to cutting into dice. The covering structure comprises a passivation region and a protective region of opaque polyimide; the protective region and the passivation region are opened above the contact pads for the passage of leads.

30 Claims, 2 Drawing Sheets

ELECTRONIC SEMICONDUCTOR DEVICE HAVING A THERMAL SPREADER

TECHNICAL FIELD

The invention relates to an electronic semiconductor device having a thermal spreader.

BACKGROUND OF THE INVENTION

As is known, containers for devices which have to dissipate a certain quantity of heat have a thermal spreader element. The thermal spreader may be formed by a metal region fixed to a ceramic base then fixed to the device or by a portion of the lead frame.

For a thermal spreader using a ceramic base, two fixing operations are required: a first operation to bond the metal region to the ceramic base and a second operation to attach the device to the metal region; consequently the fixing costs are considerable. Furthermore, this solution involves considerable space: indeed, to ensure that the device and the metal region overlap under all conditions and to prevent undesirable short-circuits even in presence of possible misalignments, the metal region has a larger area than the device; furthermore, the electrical connection wires which connect suitable conductive areas formed on the ceramic base to the contact pads of the device need to be formed at a certain distance from the metal region. Overall, therefore, the area required on the ceramic base for fixing and connecting the device is considerably larger than the area of the device. This solution further requires the manufacture of long connection wires, which is undesirable.

Forming the thermal spreader directly on the lead frame has the following disadvantages: the chip/base assembly has two interfaces; a first interface is present between the chip and the lead frame and a second interface is present between the lead frame and the ceramic base. The connection between the chip and the printed circuit requires two wires in series and thus has greater resistance.

SUMMARY OF THE INVENTION

According to the invention, there are provided an electronic device and a relative manufacturing process.

In a preferred embodiment of the invention, the electronic device is formed as one of a plurality of electronic devices formed on a wafer. Prior to cutting the wafer into dice, an integral thermal spreader of metal is galvanically grown on a lower surface of the wafer, and a covering structure, which comprises a passivation region and a protective region of opaque polyimide is formed on an upper surface of the wafer. The protective region and the passivation region are opened above the contact pads for the passage of leads.

BRIEF DESCRIPTION OF THE DRAWINGS

For an understanding of the invention a preferred embodiment will now be described, purely by way of non-exhaustive example with reference to the accompanying drawings.

DETAILED DESCRIPTION OF THE INVENTION

Figure 1:
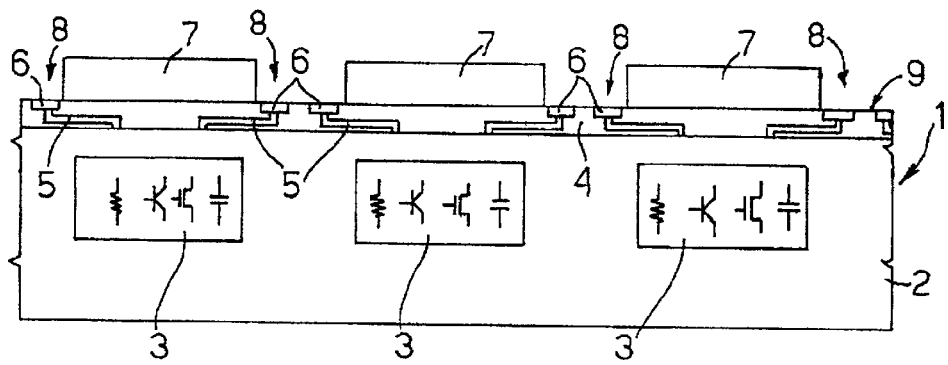
FIG. 1 shows a cross-section of a semiconductor material wafer in a first step of the manufacturing process.

FIG. 1, in which the various regions are not to scale, shows a wafer 1 comprising a body 2 of semiconductor material. In a known manner, the semiconductor body 2 has various conductive and/or insulating regions forming a plurality of identical electronic devices 3, shown in diagrammatic form by the electrical symbols of some components. An insulating layer 4, for example of BPSG (Boron Phosphorus Silicon Glass), extends on top of the body 2; metal connection lines 5 extend within the insulating layer 4 and have one end connected to the conductive regions formed inside the body 2, in known manner and not shown in detail, and one end connected to contact pads 6 facing the upper surface of the insulating layer 4. Connection lines (not shown) may reciprocally connect two or more conductive regions inside the body 2. The contact pads are formed in portions which, after the wafer 1 has been cut into individual dice, are located next to the periphery of each die, as discussed below. A passivation layer 7, of transparent polyimide, for example with a thickness of approximately 2 $\mu$m, extends on a face 9 on top of the insulating layer 4 and has been opened to form openings 8 at the contact pads 6.

Figure 2:
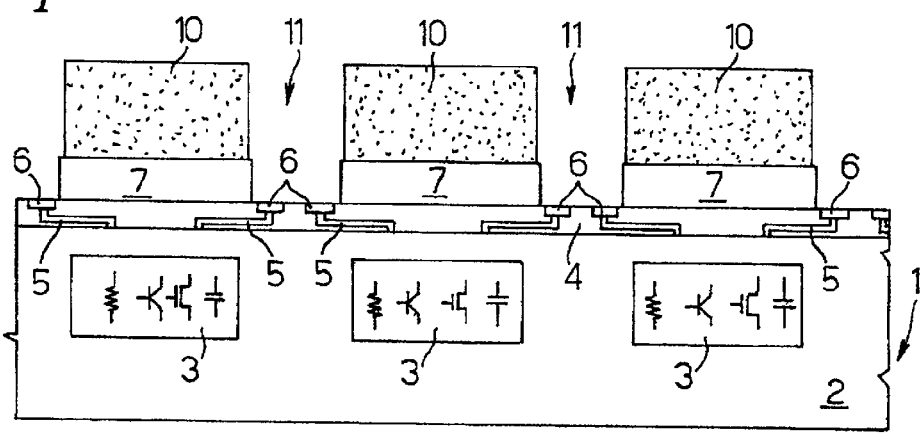
FIGS. 2 and 3 show cross-sections of the wafer of FIG. 1 in subsequent manufacturing steps.

According to FIG. 2, a protective layer 10, preferably of polyimide, for example with a thickness of 20–70 $\mu$m, preferably 30–50 $\mu$m, is then deposited on the structure of FIG. 1. The polyimide of the protective layer 10 has been rendered opaque by the presence of filler, carbon and/or graphite for example, as shown schematically in the drawings by dots, or performing a surface treatment to make it rough or again by applying an opaque upper layer (a metal layer for example). Protective layer 10 may also be formed from another thick polymer material such as the material known by the name "SU8" (Shell Upon 8), produced by SOTEC MICROSYSTEMS. Other acceptable materials may also be used for the protective layer 10.

Figure 3:
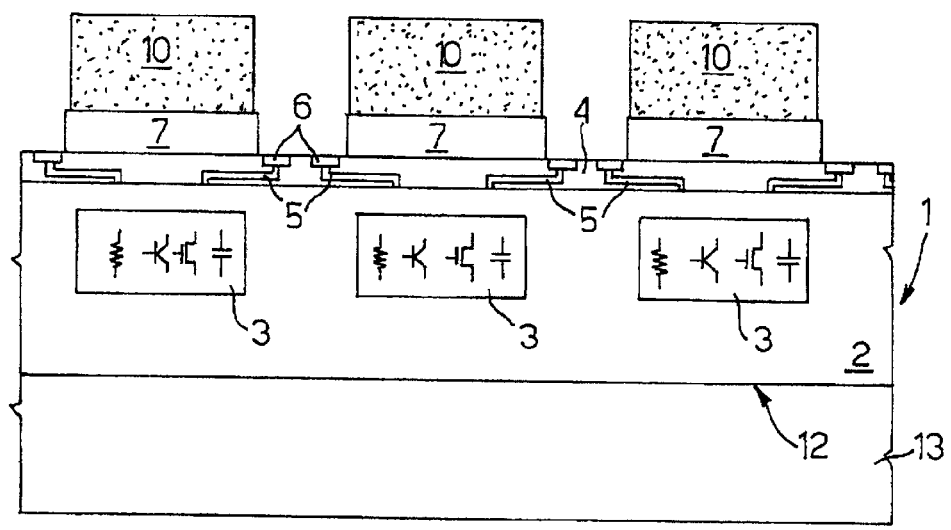

The protective layer 10 (optionally together with the opaque upper layer) is then opened by using conventional photolithographic techniques to form openings 11 extending above and in prosecution of the openings 8; only the openings 11 are labeled in FIG. 2.

as shown in FIG. 3, a metal layer 13 is then grown on a lower surface 12 of the wafer 1. Preferably the metal layer 13 is grown galvanically (electroplating technique), only the lower portion being placed in the electroplating bath and the upper surface of the wafer 1 being protected. Generally speaking, the thickness and the material of the metal layer 13 are selected in such a way as to obtain a given heat resistance with respect to the outside and thus a given heat dissipation capacity. The metal layer 13 is of copper and is thick, for example, approx. 50–200 $\mu$m, preferably 50–100 $\mu$m.

Figure 4:
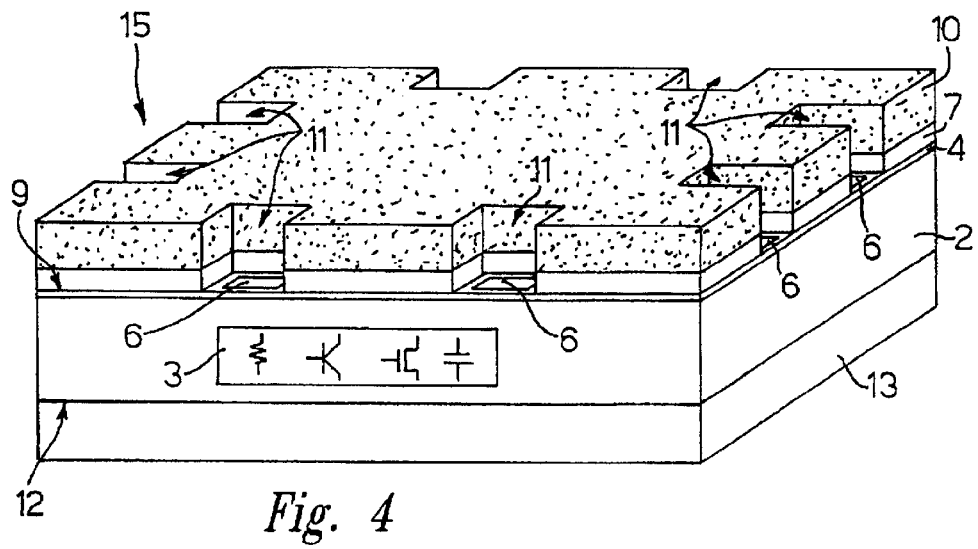
FIG. 4 shows a die obtained by cutting the wafer of FIG. 3.
Figure 5:
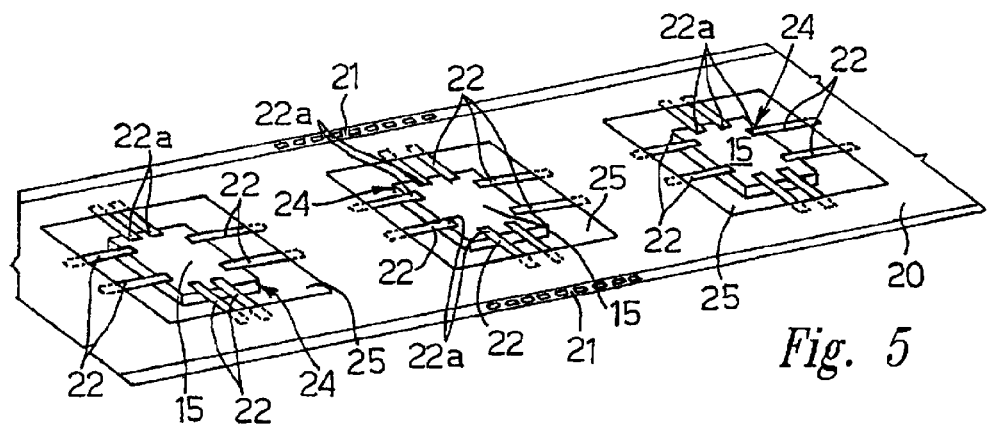
FIG. 5 shows a strip carrying a plurality of chips fixed to respective leads.

The wafer 1 is then cut into dice 15, using known methods. As shown in FIG. 4, wherein, for clarity, the regions resulting from the cutting of the various layers are denoted by the same reference numerals of the respective layers, each die 15 has a metal region 13 (adhering directly to the body 2 and defining a thermal spreader) and a protective region 10 which, in practice, replaces the conventional plastic (epoxy resin) of the package. The die 15 does not therefore need to undergo the conventional packaging operations. Furthermore, after cutting, the openings 11 are arranged on the periphery of the die 15 to allow lateral access to the contact pads 6. Leads 22 are then fixed to the die 15. Advantageously it is possible to use the known strip technique according to which the leads are carried by a flexible strip 20, of Kapton for example, having perforated entrainment edges 21. To this end, as shown in FIG. 5, the flexible strip 20 has a plurality of openings 25; the leads 22 to be connected to a die project inside each of the openings. The leads 22, preferably of gold-plated copper, are held at one end of the flexible strip 20 and are positioned exactly as required by the dice 15. Preferably the leads 22 have projections or bumps 26, FIG. 6, on their free end 22a on the face to be welded to the dice 15. For welding, the flexible strip 20 and a die 15, held and moved by a suitable machine, are brought towards each other so as to bring the free end 22a of the leads 22 inside the openings 11, with the bumps 26 in contact with contact pads 6; the leads are then welded by thermocompression or ultrasound.

After welding, as shown in FIG. 5, in each opening 25 the flexible strip 20 carries a die 15 fixed to the respective leads 22, forming a chip 24. In this way the dice 15 may be stored and transported.

Figure 6:
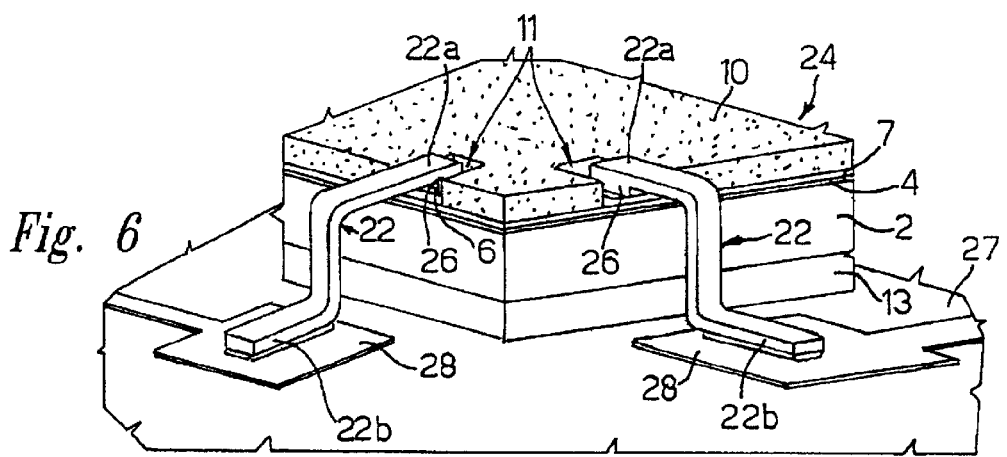
FIG. 6 shows a portion of a chip fixed to a base.

When a chip 24 is to be fixed to a ceramic base 27, FIG. 6, the flexible strip 20 is cut, so as to release the leads 22 from the flexible strip 20, the leads 22 are bent and their end, just released and denoted by 22b in FIG. 6, is welded to respective contact pads 28 present on the ceramic base 27, for example using added material, conveniently, gold, but other metals may be used.

In this way the metal region 13 forms a thermal spreader integral with the die 15. The absence of intermediate materials between the body 2 and the metal region 13 and the contact between them over the entire area of the body 2 provide high heat conduction. This solution is therefore particularly suited to devices with average power dissipation and those operating in temperatures below 180–200° C. It can be used for devices with a standard package or for hybrid circuits. It is used particularly for telephone applications, for hard disk drivers and automotive applications.

Forming the metal region 13 integrally with the die in a manufacturing phase of the wafer 1 is particularly advantageous in that it requires a single growth phase for all the dice of a wafer, eliminates a bonding phase for each base and reduces the space required for welding the leads 22. Furthermore, the leads 22 are shorter than was previously required; consequently they have improved electrical properties and less risk of breakage.

The simultaneous presence of a thick protection, formed by the protective layer 10, on the front of the chip and the thermal spreader, formed by the metal region 13 of a thick copper layer, in the back of the chip is very advantageous, since the protective layer 10 and the metal region 13 have compensating characteristics as regards thermomechanical stress, caused by the manufacture steps.

Replacing the plastic of the package with the protective region 10 enables manufacturing costs to be reduced, since the protective region is formed during wafer manufacturing, and does not require a suitable molding for each die 15. The protective region 10 is highly robust and from the mechanical point of view it adequately protects the die 15 which can therefore be handled without damaging the components of the integrated electronic device; in particular, the protective layer 10 protects the wafer 1 during the steps required to form the metal layer 13.

An additional protective layer may optionally be formed over the assembly to enclose a part of leads 22 and a part of the device, to further protect the device and lead connections. Alternatively, the entire assembly may be enclosed, leaving only the bottom face of the metal layer exposed to dissipate heat.

The term "thermal spreader", as used in this document refers to a structure that dissipates heat from a semiconductor device, in the manner of a heat conductor or heat sink. A thermal spreader is a structure that spreads heat energy. Such a structure is designed with parameters appropriate to dissipate the heat energy produced in a particular semiconductor device in a particular environment, and thus maintain the device at an optimum operating temperature. Parameters that affect the heat dissipation properties of a thermal spreader include composition, mass, surface area in contact with the device, presence of contaminants or intermediate materials between thermal spreader and device, and surface area in contact with other, secondary heat dissipation mediums. Possible secondary heat dissipation mediums are air or other gas, fluid coolants, or the ceramic base described in this document.

Finally it will be clear that numerous modifications and variations may be introduced to the electrical device and the manufacturing process described herein, all of which come within the scope of the invention, as defined in the accompanying claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An electronic device, comprising:

a body of semiconductor material having a first and a second face;

an electrical connection region formed on a periphery of said first face;

a covering structure, covering said first face and including an upper face and a side face;

an opening in said covering structure extending in portions of the upper and side faces, the opening being configured to receive a portion of a selected lead and positioned to expose a portion of the first face, including said electrical connection region, such that the portion of the selected lead is positionable within the opening to contact the electrical connection region; and a heat dissipation region, in direct contact with said second face.

2. The electronic device of claim 1, wherein said heat dissipation region and said second face of said body have equal area.

3. The electronic device of claim 1, wherein said heat dissipation region is of metal, preferably of copper.

4. The electronic device according to claim 1, wherein said heat dissipation region has a thickness of 50 to 200 $\mu$m.

5. The electronic device according to claim 1, wherein said covering structure comprises a passivation region and a protective region of a polymer material.

6. The electronic device of claim 5, wherein said polymer material comprises polyimide.

7. The electronic device of claim 5, wherein said polymer material comprises "SU8".

8. The electronic device according to claim 5, wherein said protective region is opaque.

9. The electronic device according to claim 5, wherein said protective region has a thickness of 20 to 70 $\mu$m.

10. The device of claim 1, further comprising the selected lead, affixed at a first end to the electrical connection region and extending from the connection region in a direction substantially parallel to the first face.

11. The device of claim 10 wherein a surface area of the portion of the selected lead in contact with the electrical connection region and affixed thereto is less than the surface area of the portion of the first face.

12. The device of claim 10 wherein a second end of the selected lead is affixed to a flexible strip.

13. The device of claim 10 wherein a second end of the selected lead is affixed to a contact pad on a ceramic base.

14. An electronic device, comprising:
a body of semiconductor material having first and second faces parallel to each other, and a third face transverse to the first and second faces;
an electrical connection region formed on a periphery of said first face;
a covering structure, covering said first face and having a fourth face coplanar with the third face and a fifth face substantially parallel to the first and second faces;
an opening in said covering structure extending in portions of the fourth and fifth faces, the opening sized and positioned to expose a portion of the first face, including said electrical connection region, and configured to admit a lead extending from a direction transverse to the third face, to contact the electrical connection region; and
a heat dissipation region, in direct contact with said second face.

15. An electronic device, comprising:
a body of semiconductor material having first and second faces substantially opposite each other and a third face lying in a plane transverse to the first and second faces;
an electrical connection region formed on a periphery of said first face;
a covering structure, covering said first face;
a metallic lead affixed to the connection region and intersecting the plane of the third face;
an opening extending in portions of a side and a top face of the covering structure positioned over the connection region and configured to provide access thereto, for the metallic lead positioned therein; and
a heat dissipation region, in direct contact with said second face.

16. A semiconductor device, comprising:
a semiconductor material body having an upper face and a side face;
an electronic component formed in the semiconductor material body;
an electrical connection region formed on the upper face and in electrical contact with the electronic component;
a covering structure formed on the upper face of the semiconductor material body and having upper and side faces, the upper face of the covering structure being approximately parallel to the upper face of the body and the side faces of the covering structure and body being coplanar with each other; and
an opening in the covering structure, extending in portions of the upper and side faces thereof, the opening sized and positioned to expose the electrical connection region.

17. The semiconductor device of claim 16, further comprising a metallic lead affixed to the electrical connection region and extending laterally from the semiconductor material body.

18. The semiconductor device of claim 16, further comprising a heat dissipation region coupled to a lower face of the semiconductor material body.

19. The semiconductor device of claim 18, wherein the heat dissipation region and the lower face of the body have equal area.

20. The semiconductor device of claim 18, wherein the heat dissipation region is of metal, preferably of copper.

21. The semiconductor device according to claim 18, wherein the heat dissipation region has a thickness of 50 to 200 µm.

22. The semiconductor device according to claim 16, wherein the covering structure comprises a passivation region and a protective region of a polymer material.

23. The semiconductor device of claim 22, wherein the polymer material comprises polyimide.

24. The semiconductor device of claim 22, wherein the polymer material comprises "SU8".

25. The semiconductor device according to claim 22, wherein the protective region is opaque.

26. The semiconductor device according to claim 22, wherein the protective region has a thickness of 20 to 70 µm.

27. The semiconductor device of claim 16, further comprising a metallic lead, affixed at a first end to the electrical connection region.

28. The semiconductor device of claim 27 wherein a surface area of the portion of the metallic lead affixed to the electrical connection region is less than the surface area of the portion of the first face.

29. The semiconductor device of claim 27 wherein a second end of the metallic lead is affixed to a flexible strip.

30. The semiconductor device of claim 27 wherein a second end of the metallic lead is affixed to a contact pad on a ceramic base.

* * * * *